United States Patent [19]

Bleil

[11] Patent Number: 4,775,443
[45] Date of Patent: Oct. 4, 1988

[54] METHOD AND APPARATUS FOR ZONE REGROWTH OF CRYSTAL RIBBONS FROM BULK MATERIAL

[76] Inventor: Carl E. Bleil, 132 Chalmers Dr., Rochester, Mich. 48063

[21] Appl. No.: 826,596

[22] Filed: Feb. 6, 1986

[51] Int. Cl.$^4$ .................. C30B 13/30; C30B 13/34
[52] U.S. Cl. .................. 156/620; 156/DIG. 88; 156/DIG. 97; 156/617.1
[58] Field of Search .............. 156/617 R, 617 H, 620, 156/DIG. 88, DIG. 97; 422/24.9

[56] References Cited

U.S. PATENT DOCUMENTS

| | | | |
|---|---|---|---|
| 2,415,025 | 1/1947 | Grell et al. | 156/620 |
| 3,378,409 | 4/1968 | Harle et al. | 156/620 |
| 3,681,033 | 8/1972 | Bleil | 422/249 |
| 3,759,671 | 9/1973 | Bleil | 422/249 |
| 4,226,834 | 10/1980 | Shudo et al. | 422/249 |
| 4,325,777 | 4/1982 | Yarwood et al. | 156/620 |
| 4,417,944 | 11/1983 | Jewett | 156/617 H |
| 4,563,976 | 1/1986 | Foell et al. | 156/617 H |

FOREIGN PATENT DOCUMENTS 58-147024 9/1983 Japan .................. 156/617 R

Primary Examiner—John Doll
Assistant Examiner—Robert M. Kundmund
Attorney, Agent, or Firm—Seed and Berry

[57] ABSTRACT

A method and apparatus for producing crystalline ribbons of a material from a "crucible-less" configuration of bodies of the material including possible deposition on a substrate. Means for coupling electromagnetic energy into a source body of material are provided to appropriately induce electrical currents in order to control and restrict the molten zone and suppress net loss of the heat of fusion from the balance of the ribbon-like body. The melt zone is replenished to sustain the shape and size of the growing ribbon-like body. The heat of crystallization is selectively removed by a heat absorbing means from one end of the melt zone in a direction substantially perpendicular to the direction of pulling.

7 Claims, 3 Drawing Sheets

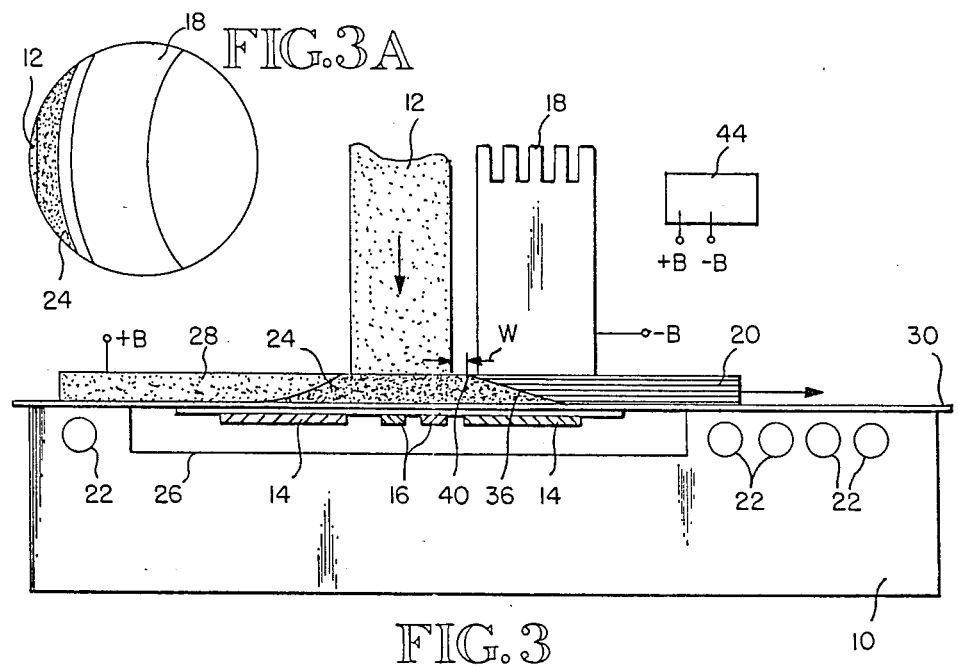
FIG. 3A
FIG. 3
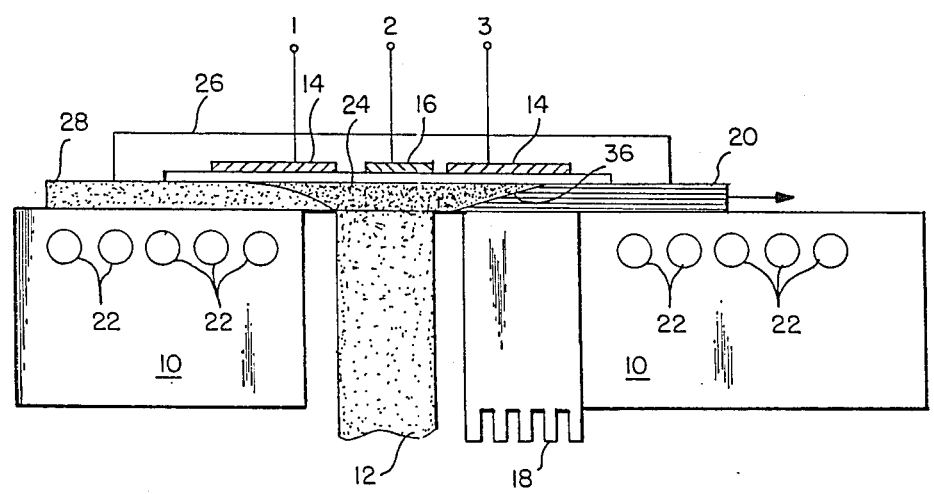
FIG. 4

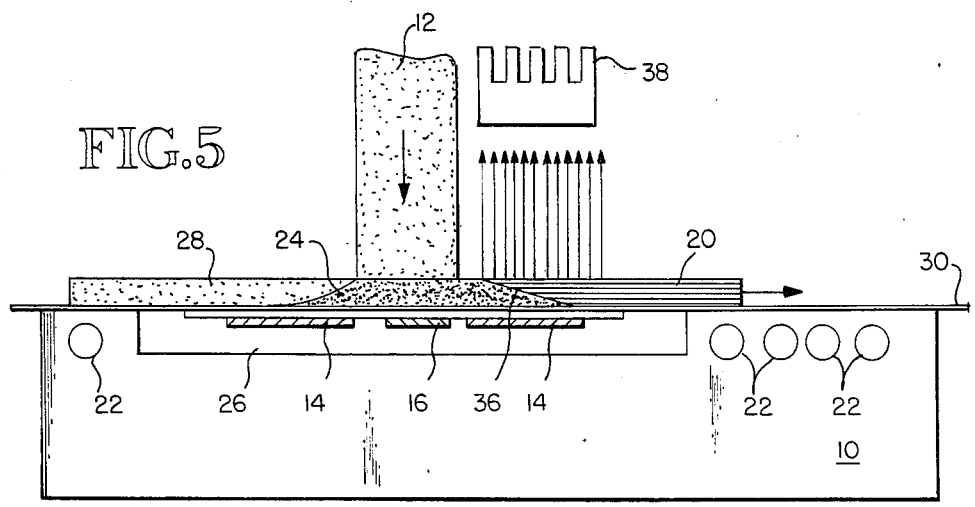
FIG. 5
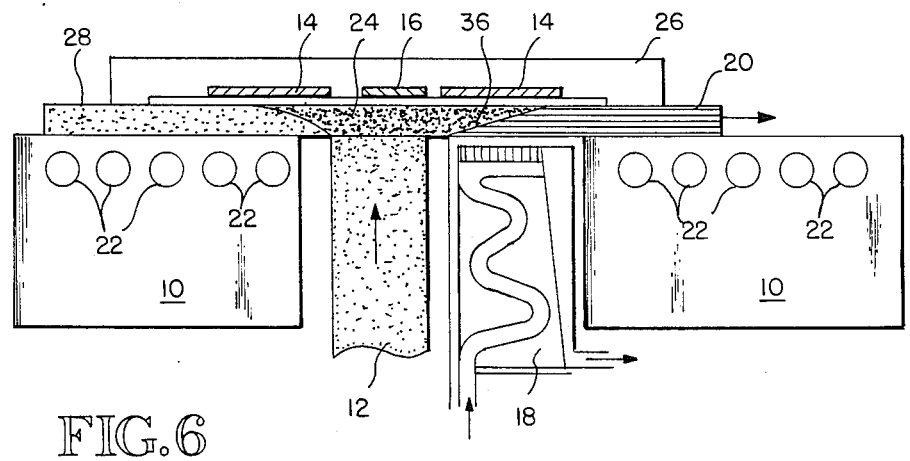
FIG. 6
FIG. 7
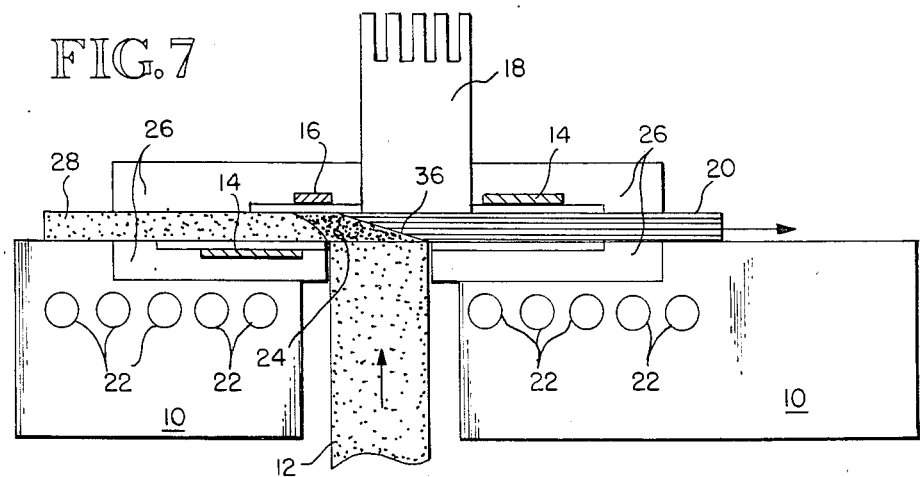

4,775,443

METHOD AND APPARATUS FOR ZONE REGROWTH OF CRYSTAL RIBBONS FROM BULK MATERIAL

FIELD OF THE INVENTION

The method and apparatus described relates to the production of crystalline ribbons by zone melting. More particularly it relates to a method and apparatus for coupling electromagnetic energy into a thin layer of material in order to raise the temperature of the material to nearly its melting point except along a specified zone where the material is caused to melt.

BACKGROUND OF THE INVENTION

There is a need for thin crystalline ribbons and films of many materials such as silicon and other semiconductors. These ribbons are often very costly and difficult to produce. For example, then wafers of monocrystalline semiconductor materials are generally produced from monocrystalline boules grown by the Czochralski technique. The preparation of the thin wafers from large crystal boules requires slicing and polishing, is a costly and time consuming technique, and inherently wastes much of the boule. Consequently, much effort has been directed toward growing thin monocrystalline ribbons that need only be scribed and broken to be used.

As reported, for example, by Chalmers, LaBelle, and Mlavsky in "Edge-Defined Film-Fed Growth," Journal of Crystal Growth, vol. 13/14, pp. 84-87, 1972, thin ribbons of semiconductors and insulators have been grown through elongated openings in a melt cover. Such growth has also been accomplished with guide posts. In these techniques the crystal is pulled in a direction perpendicular to the surface of the melt using the geometric properties of a slot in the melt cover or guide posts to establish the transverse cross section of the resulting ribbon. However, satisfactory larger ribbon widths of appropriate thickness are not favored by surface tension properties and are produced only slowly, with reduced commerical advantage. The slow growth requirement arises because the probability of grain-boundary defects is proportional to the square root of the growth velocity (pull velocity in this case), as confirmed by Pfeiffer, et al., in "Pattern Formation Resulting from Faceted Growth in Zone-melted Thin Films," Physical Review Abstracts, vol. 16, no. 10, May 15 1985.

Ribbons of semiconductors have also been produced by pulling substantially in a horizontal plane from a melt surface, as disclosed by Bleil in U.S. Pat. Nos. 3,681,033 and 3,759,671. This latter technique produces ribbons much faster than the previous methods. However, pulling a ribbon too quickly or at too great an angle from horizontal introduces grain boundaries and imperfections which degrade the performance of circuitry placed on the semiconductor surface. This fact has been described in detail in Jewett in U.S. Pat. No. 4,289,571 and Kudo in U.S. Pat. No. 4,329,195. Moreover, the necessary controls to implement the process and produce very thin crystal ribbons and films of good quality are difficult to manange and thus the commercial advantage is reduced.

It has also been proposed to horizontally produce flat ribbons by certain zone melting techniques. This has been described by Geis et al. in "Materials Research Society Symposium," vol. 13, p. 477, 1983, and Omachi et al., "Ge-Seeded Crystallization on $SiO_2$," in electronics Letters, vol. 19, no. 8, Apr. 14, 1983, the latter by using a slider system with RF heated strip heater. However, such techniques develop freezing isotherms nearly perpendicular to the pulling direction and have not been wholly satisfactory for producing thin ribbons of high quality at low cost. Such difficulties may be avoided by crystallization according to the present invention. Ribbons of materials other than semiconductors may be similarly produced by zone melting and recrystallization as shown by this invention.

In some applications, it is desirable to prepare monocrystalline ribbons or films of semiconductors or other materials on insulator substrates, such as semiconductor on insulator, or SOI, structures. This can be accomplished by growing the ribbon on the insulator or bonding the ribbon onto insulator material by using, for example, electro-bonding techniques. The desired monocrystalline structure can be given to the ribbon material through a variety of "seeding" techniques, including beginning and maintaining the seeding process at a location away from the insulator material, thereby inducing a monocrystalline form to be propagated through the ribbon cross section.

For ribbons or SOI structures, a variety of methods for supplying the zone-melting energy have been used, including lasers and graphite heaters with energy-focusing means. Methods for inducing electrical currents in the semiconductor and other materials, by exposing them to a high frequency electric field, have been used to recrystallize the cylindrical boules in a particularly energy efficient manner. However, induction methods have only recently been applied to ribbons in a manner permitting control of the shape and size of the zone of recrystallization as disclosed by Bleil in U.S. patent application Ser. No. 816,424, filed Jan. 6, 1986. It is desirable to use current induction to avoid direct contact between the material and the electrodes and to cause zone recrystallization in a thin layer of the material in a manner allowing the shape and size of the zone to be controlled.

SUMMARY OF THE INVENTION

I have discovered that through proper placement of approximately shaped electrodes near the surface of a thin layer of material which exhibits sufficient electrical conductivity near its melting point, heating by means of induced electrical currents can produce desirable recrystallization zone sizes and shapes. Generally, in accordance with this discovery, two sets of sheet electrodes are used. A first set of electrodes, near the surface of the ribbon and separated in the pulling direction, induces electrical currents, within a specific portion of the layer, that are sufficient to raise the material to very nearly its melting temperature. A second pair of electrodes induce enough additional currents to cause a narrow region within the specific portion of the material to melt along a selected stable zone perpendicular to the pulling direction. Proper control of the two currents induced, in coordination with means for replenishing the melt zone and a means for removing the heat supplied by the induction currents, allows the recrystallization to take place in a desired fashion, at an acceptably high pulling rate.

According to one aspect of the invention, there is provided an apparatus for forming a crystalline ribbon-like body from a substantially planar shaped layer of material comprising heating means for coupling electromagnetic energy into the material layer to induce electric currents and cause the material to melt along a relatively narrow melt zone within the material, means for causing relative motion between a portion of the material and the heating means, means for replenishing the melt zone, and means for controllably removing heat from the melted material in a direction substantially perpendicular to the plane of the growing crystal ribbon.

In accordance with a preferred embodiment of the invention, there is provided an apparatus for forming a ribbon of crystalline material, comprising first heating means for coupling electromagnetic energy into a layer of material to induce electrical currents which cause the layer to attain a temperature very near its melting temperature without melting the layer, second heating means for coupling electromagnetic energy into the layer to induce electrical currents causing the layer material to melt along a relatively narrow region transverse to a predetermined pulling direction, means for causing relative motion between a portion of the layer material and the first and second heating means, means for replenishing the melt layer, and means for controllably removing heat from the melted material in a direction substantially perpendicular to the plane of the crystallizing ribbon. The layer of material may include a monocrystalline seed and the first heating means can comprise a pair of substantially parallel electrodes spaced apart in the pulling direction, slightly spaced away from the plane of the layer and connected to a source of alternating voltage.

A variety of configurations for the second inductive heating means are possible, including (1) two sets of colinear interdigitated electrodes coplanar with, or parallel to and on the opposite sides of the ribbon-like layer form, the first heating means, and located between the two electrodes of the first heating means and (2) a pair of substantially parallel electrodes, coplanar with, or parallel to and on the opposite side of the ribbon-like layer from, the first inductive heating means and spaced apart in the pulling direction. The first and second heating means are connected to independent rf voltage sources.

An alternative high-frequency voltage heating means comprises only three parallel electrodes spaced apart in the pulling direction with a first high-frequency voltage source connected between first and second electrodes and a second high frequency voltage source connected between the second and third electrodes. The two voltage sources operate at different frequencies. The three electrodes may be on the same or different sides of the ribbon-like layer.

A method in accordance with the invention for forming a crystalline ribbon of material from a substantially planar layer of material comprises the steps of coupling electromagnetic energy into the layer material to induce electrical currents in the layer and cause at least a portion of the material to attain a temperature near the material's melting temperature while the material remains a solid, further heating a selected portion of the material which has attained a temperature near its melting point, causing the material to melt with a well defined region, causing relative motion in a predetermined direction between a portion of the material and the heating means, replenishing the melt as required, and controllably removing heat from the melted material in a direction substantially perpendicular to the plane of the growing crystal ribbon.

BRIEF DESCRIPTION OF THE DRAWINGS

FIG. 3 is an enlarged fragmentary elevational view of the melt-seed-heat sink contact region of an inverted configuration of the apparatus shown in FIG. 1 with a modified secondary heat source consisting of two parallel electrodes;

FIG. 3A is a plan view of the melt-seed-heat sink contact region shown in FIG. 3;

FIG. 4 is an enlarged fragmentary elevational view of a modification of the secondary heat source for the apparatus shown in FIG. 2 in which a single electrode is provided for the secondary source;

FIG. 5 is an enlarged fragmentary view of a modification of the selective heat sink of FIG. 3, to allow for radiative cooling;

FIG. 6 is an exaggerated enlarged fragmentary view of a melt-seed-heat sink contact region of a further modification of the apparatus of FIG. 2, wherein the heat sink is provided by the passage of cooling gasses over the ribbon; and FIG. 7 is an exaggerated elevational view of another electrode configuration in which the primary electrodes are parallel but on opposite sides of the ribbon.

DESCRIPTION OF THE PREFERRED EMBODIMENT

Figure 1:
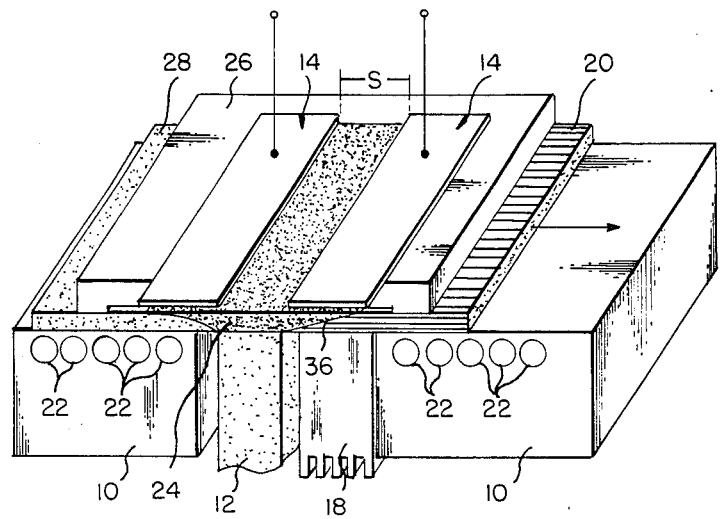
FIG. 1 is an exaggerated isometric view in partial section of the melt area of a zone-melt growing apparatus provided with a melt replenishment source and a heat sink for horizontal crystal growing in accordance with the invention.

A better appreciation of the various aspects of the invention may be gained by reference to the figures of the drawings. Principal features of the invention lie in the localized application of heat to a layer of material, the selective removal of heat in a direction perpendicular to the pulling direction at one end of the melt zone, replenishment of the melt as required, and suppression of the loss of the heat of fusion from the balance of the material layer. The heat is applied locally by inducing electrical currents between relatively closely spaced electrodes, melting the layer in a narrow zone. A heat sink in physical contact with the growing ribbon can be used to selectively remove the heat of crystallization from the selected end of the growing ribbon as shown in FIGS. 1-4 and 7. On the other hand, the heat can be removed by simply allowing it to radiate to the ambient or by use of cooling gases as shown in FIGS. 5 and 6, respectively. The end of the ribbon where the heat is lost becomes the seed end of the growing ribbon.

The melt zone is suppressed in the balance of the layer by controlling the current from primary and secondary electrodes. The melt zone is confined and stabilized, when required, with the secondary electrodes, to be within the heated zone defined by the primary electrodes. Growth rate can be suppressed by reducing the rate of heat loss of the heat of fusion. This can be done by controlling the secondary heat source and/or the selective heat sink.

A special heater may replace the loss of the heat of fusion, or a heat reflector may reduce the loss of the heat of fusion. If there is any actual loss of the heat of fusion, it is replaced by a heat source other than the melt itself. For example, such a heat source might be placed around the source material. Hence, the heaters and/or heat reflectors, along with the selective heat sink, establish a freezing isotherm between the growing ribbon and the melt that is determined in part by the selected ribbon width and thickness.

Because the probability of generating dislocations in a growing crystal is nearly proportional to the square root of the growth velocity, it is important to keep the growth velocity low even while maintaining a high pulling rate. This is accomplished by keeping the freezing isotherm as close to parallel to the pulling direction as practical. Angles less than 10° are desired.

When the growing ribbon is pulled substantially parallel to the direction of the current induced by the primary electrodes, the molten zone and recrystallization may be distorted in the direction of pulling but remains substantially fixed in space as a narrow region of closely controlled cyrstal growth. Unlike other systems for zone recrystallization, the principal regrowth direction in this embodiment occurs substantially perpendicular to the pulling direction, except at the tip of the growing ribbon.

The surface of the growing ribbon facing the selective heat absorber and the surface of the molten zone should be coplanar, at least where they are adjacent to the growing tip of the ribbon. The growing tip is the intersection of the freezing isotherm with the ribbon surface facing the heat sink.

The growing tip can be made coplanar with the adjacent melt surface by making the entire ribbon coplanar with the surface of the layer molten zone. The surface tension of the material can maintain this coplanarity. Coplanarity is also achieved by using for example the material source as a contact element that is wetted by, but does not contaminate the melt. This again allows the surface tension forces to maintain the ribbon-melt coplanarity at the tip. I prefer to use both principles where appropriate to the desired goal.

The new growth on the ribbon may tend to adhere to the heat sink means, depending on the material. The crystal can be prevented from adhering to the contacting surface of the heat sink if there is no strong reaction between their contacting surfaces near the crystal melting point, or if they are not touching. If crystal-heat sink adherence is a problem, an interface may be used between the ribbon and the heat sink, and/or nucleation of the crystal must be induced sufficiently far away from the heat sink. This can be readily accomplished by several means: (a) adjusting the spacing of the primary electrodes, (b) positioning of the secondary heat source, the replenishment source, or the selective heat sink, (c) pulling the ribbon at the appropriate rate, or (d) adjusting the rate of nucleation to substantially maintain this spacing during growth. Moreover, heat removal may be accomplished by radiative cooling or by convective or conductive cooling by an inert gas such as argon or helium, thus avoiding heat sink adherence or contamination.

Of course, the usual precautions pertaining to the choice of materials, ambient atmosphere, vibration-free environment and other routine growth conditions, well-known to those skilled in the art, should be observed with this invention, just as they would in the usual zone melting and crystal growing techniques.

For the implementation of the invention several additional factors must be considered. It is noted that the invention applies equally well to many metals and semiconductors and certain insulators that exhibit significant electrical conductivity near their melting point. Most materials will show measurable changes in their density, surface energy, electrical and thermal conductivity as they undergo the phase change from solid to liquid at their melting temperature.

Figure 2:
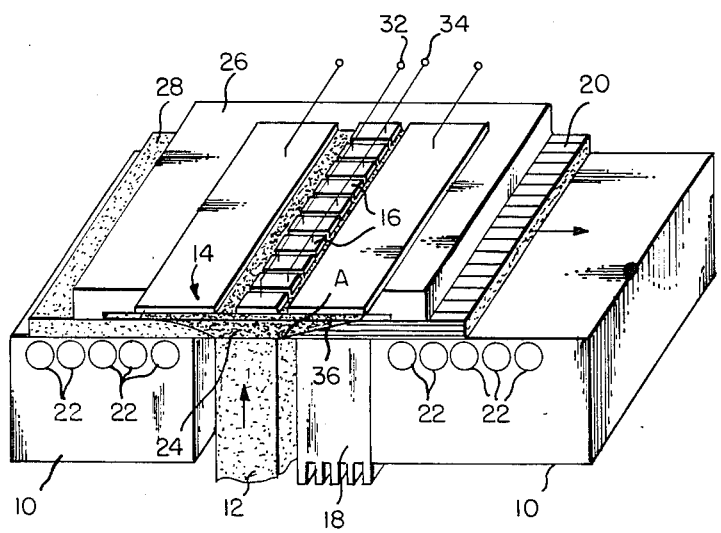
FIG. 2 is an enlarged fragmentary isometric view in partial section of a modification of the apparatus of FIG. 1 in which a secondary heat source is shown as a set of interdigitated electrodes.

The particular embodiment of this invention to be used for a particular ribbon material will depend on the property changes mentioned above. For materials, such as silicon, whose electrical conductivity is greater in the melt than in the solid, it is prudent to use an embodiment that stabilizes the melt against small local fluctuations in the electrical resistance as shown in FIG. 2. Lack of stability can lead to disruptive melt zones and irregular regrowth.

Other apparatus embodiments for materials of this type are also possible. For example a single coil configuration consisting of a multiplicity of turns around the layer to be melted and in a plane substantially parallel to the ribbon can induce an eddy current in a narrow zone in which the current flows across the width of the layer in a direction substantially perpendicular to the pulling direction. When melting occurs the result of each of the above embodiments is to confine and stabilize the molten zone.

For materials, such as bismuth and many metals, where the conductivity of the solid is significantly larger than the liquid at the melting point, it may be convenient to use an electrode configuration as shown in FIG. 1 or as shown in FIGS. 3 and 4 with or without the secondary electrode.

Still another electrode configuration for this class of materials is represented by the placement of the primary electrodes on opposite sides of the ribbon as shown in FIG. 7. For special cases dictated by the material properties, a second heat sink may be desired to control the shape of the melt zone and the angle of the freezing isotherm relative to the pulling direction. For materials of this type the molten zone is automatically stabilized with regard to local variations in electrical conductivity and will remain between the electrodes. One or another of these configurations will also serve for the special case for which there is no change in the electrical conductivity during melting.

For all types of ribbons above (e.g. silicon and bismuth) it is also necessary to consider the ratio of the surface energy to the density at and above the melting point. Silicon exhibits a very large surface energy-to-density ratio as compared to bismuth. The result of this property is that the width W of a stable silicon melt zone free surface as shown in FIG. 3 (horizontal growth) will be much smaller than that for bismuth. For the case of silicon ribbon less than 500 $\mu$m thick this width of the molten zone free surface is comparable to the ribbon thickness whereas, for bismuth in this configuration, widths five times the thickness have been observed. This parameter may be relaxed when the ribbon is made to adhere to a solid substrate. Silicon films 0.5 mm thick on a quartz substrate have been shown to support a stable melt zone free surface 2 mm wide.

In addition to the above it is known that silicon, for example, exhibits a significant increase in its thermal conductivity at it passes from the solid to the liquid state. Such changes as that can alter the central point for the applied voltages to the primary and secondary electrodes as well as the control temperature and thermal profile for the heat sink. These parameters may be separately adjusted during processing as well as the electrode spacings relative to the ribbon, the heat sink and to each other.

For simplicity, the subsequent discussion will be restricted to one ribbon material, i.e. silicon. While, in the following discussions, the source body will be assumed to be in the form of a solid, those skilled in the art will recognize that the source body can take any of a variety of forms. These include powders, compacts, or even properly contained liquids.

FIGS. 1 and 2 show the melt zone area of a silicon crystal ribbon growing apparatus made in accordance with the invention. To focus attention on the improvements this invention presents, the ancillary features normally incident to zone melting crystal growth apparatus, such as a housing and support means for producing a protective environment, heater power supplies, pulling apparatus, and the like, are not shown. However, for example, the apparatus would involve heating power supplies, a controlled pulling system, and means for precision positioning of the electrode ensembles, a means for moving source material into the melt zone, a regulated atmosphere environment, temperature monitoring, etc.

In the areas of the crystal growing apparatus within which the principal processing will occur, a heated platform 10 with heaters 22 is provided on which is placed a seed ribbon 20 of monocrystalline silicon.

The ribbon 20 can be placed and transported on a continuous thick substrate 30, as shown in FIG. 3, made for example, of an electrically insulating material, depending upon the application for which crystallized ribbon 20 is intended. It will be understood by those skilled in the art that some applications will not require or use a substrate 30 or that other conducting substrates can be used. The ribbon can typically be 100 $\mu$m thick. The ribbon is pulled toward the right in FIG. 1. The left end 28 of the ribbon is clamped to the platform 10. The platform is typically four inches wide and four feet long although the method and apparatus of the present invention work regardless of these dimensions. In the central processing region, two principal sheet electrodes 14, mutually coplanar and parallel, and extending the full width of the ribbon 20, are positioned in close proximity to the ribbon 20 with an interelectrode space s along the greater length of the electrodes. The electrodes are each 75 mm wide, 100 mm long and 0.10 mm thick. They are spaced 30.1 mm apart along their greater length and positioned about 0.100 mm from the ribbon 20. The spacing between the electrodes is chosen to permit the source material 12 to pass between them, if desired. Some of these dimensions are exaggerated in the figures to make certain features of the apparatus more apparent. The principle electrodes will provide the rf resistance heating in this approximately 180 mm region.

In the region between the principal electrodes 14, two sets of secondary sheet electrodes 16 are placed, as shown in FIG. 2, to provide the additional localized heating when required to cause stable melting within the heated zone. These electrodes are 20 mm wide, collectively 100 mm long and individual electrodes are spaced apart 0.20 mm. They are substantially parallel to the principal electrodes 14.

The members of one set of secondary electrodes alternate, or are interdigitated, with members of the other set. As shown in FIG. 2, the members of each of these two sets are electrically connected through wires 32 and 34, respectively. By connecting a high-frequency voltage source between wires 32 and 34, the desired narrow molten zone is created. The frequency of the electrical voltage applied to the secondary electrodes may differ from that of the primary electrodes, depending on the material, electrode spacings, and the electrode geometry. For the dimensions given above, an appropriate frequency for the primary electrodes will be approximately 13.6 MHz. It will be understood by those skilled in the art that these dimensions may be varied in accordance with the source dimensions, heating requirements, and the rf frequencies used. The molten zone produced by the secondary heat source 16 will preferably have its free surface width W (see FIG. 3) comparable to or less than the ribbon thickness, when required for stable growth.

The current induced in the heated region by the principal electrodes 14 and secondary electrodes 16 will reach a maximum when the ribbon temperature is near the melting point (1412° C.) for silicon but for which melting has only occurred within the boundaries of the principal electrodes and adjacent to the source material. The initial resistance of the region between the principal electrodes 14 is lowered by being preheated by the heated platform 10, if required, in order to allow them to function properly.

The melt zone shown in FIG. 2 will only exist when the secondary heater 16 provides and maintains at least a portion of the heat of fusion required for the selected melt volume. In this preferred embodiment the silicon ribbon 20 is 100 mm wide and 0.10 mm thick. The free molten zone is nominally 30 mm wide, 0.100 mm thick, and 100 mm long (that is, the full width and thickness of the film). The width of the melt shown at "A" in FIG. 2 is comparable to the ribbon thickness.

Heat sink 18, for example, a heat pipe, extracts heat from the molten zone at a rate just sufficient to maintain the melt-crystal isotherm 36 in the heated region.

A source of new silicon material 12, 30 mm thick and having the width of the ribbon, is introduced through one free surface of the melt zone. This may be provided from below as shown in FIG. 2 and serve as one boundary of the melt zone. It can be seen in FIG. 2 that in this embodiment the melt does not make contact with any foreign substance which might contaminate the growing crystal ribbon. In this sense this particular embodiment constitutes a "crucible-less" regrowth of the crystal ribbon. The rate of replenishment of the melt is controlled by monitoring the shape, size, and thickness of the melt zone and of the growing crystal ribbon.

Extracting heat from one side of the ribbon, positioning the secondary heat source nearer to the heat sink than to the fixed portion of the layer, and providing primary heating from the side opposite the heat sink promotes nucleation of crystalline silicon on the side of the heat sink in the direction opposite to the pulling direction, while principal growth continues substantially perpendicular to the pulling direction. That is, the melt-crystal isotherm 36 is substantially as shown in FIG. 2. In FIG. 2 the nucleation occurs at a free surface of the melt, while in certain inverted configurations in which a substrate is used, such as that shown in FIGS. 3 and 3A, the nucleation may be caused to occur in the proximity of a substrate such as 30. This latter configuration would have the heat sink adjacent to the substrate and be particularly useful when liquid epitaxy is to be exploited.

Several techniques are available for initially seeding the crystal growth in the desired crystal orientation.

After initial seeding, continuous seeding will be subsequently established by the growing crystal ribbon. In a preferred embodiment a seed 20 whose thickness and width are substantially the same as the ribbon to be grown (i.e. 100 mm wide and 0.10 mm thick) is selected (see any of the figures). The length of the seed selected is commensurate with the needs of the crystal pulling attachment (not shown). The major faces of the selected seed are parallel and in the (100) plane when this orientation is desired. The seed is oriented, for example, so that the pulling will take place along the <010> direction.

Other techniques, well-known in the art, may also be used to provide initial seeding for each growth as required. For example, a seed may be inserted into the melt zone from the right or a single crystal growth may be gated by necking down the growing ribbon width one or more times to eliminate alternative crystal orientations.

FIGS. 3–7 show further modifications of the apparatus illustrated in connection with FIGS. 1 and 2. The modifications involve the construction of the heat sink used to selectively remove heat from the growing ribbon, (or seed), a means to enhance and control nucleation, and the nature of the special heat source used to maintain the desired freezing isotherm within the molten zone.

Reflectors may be selectively introduced to reduce the heat loss from the molten zone. The reflective properties, such as good infrared reflection, are used to return the energy radiated from the molten zone back into the molten zone. In certain embodiments the electrodes may serve as reflectors if desired.

In FIGS. 3 and 3A another embodiment of the secondary heat source incorporates two parallel electrodes with their separation along their greater length. This configuration is preferred when the melt exhibits a higher resistance than the solid of the material being processed and additional melt stability is required. The primary electrodes are connected to a first rf voltage source, while the secondary electrodes are connected to a second rf voltage source. By properly controlling the two voltage sources, the melt zone can be kept within desirable limits.

In FIG. 4 the heater comprises a special combination of primary and secondary electrodes 14 and 16 to achieve ribbon melting only in the region of the single central (secondary) electrode 16. To achieve this result voltages having different frequencies are applied to the outer electrodes, with the central electrode 16 grounded. Thus, when the two applied voltages are out of phase a current passes principally between the outer electrodes 14, while when they are in phase essentially no current passes between the outer electrodes and nearly twice the current passes to ground through the center electrode 16. Proper selection and control of the frequency difference, electrode size and spacing, and the applied voltage will selectively heat the area between the outer electrodes but only melt the region near the center electrode. In this configuration, heat can be removed from the lower surface by heat sink 18.

An ancillary line heating source may be used in place of the secondary heater 16 shown in the preceding figures. Such a source might be an electron line source, or any highly localized line source, such as a laser, to permit the molten zone to be confined in the heated region.

In FIG. 5 the heat loss is achieved by radiative cooling to realize slow cooling and/or to avoid possible melt-heat sink contact. The lower electrodes 16 and 14 may be used as reflectors to return heat radiated by the molten-zone, and heat of fusion is lost by the radiation process by way of a non-contacting heat sink 38.

FIG. 6 shows a modification of the apparatus of FIG. 1 wherein the heat loss is achieved by convective cooling with an inert gas such as argon or helium. A gas conductive cooling means using, for example, an inert gas with a high thermal conductivity, such as helium gas coupled to a non-contacting heat sink is also applicable to this configuration.

As shown additionally in FIG. 3, a modification of the apparatus of this invention, intended to assist in the control of the nucleation region consists of a bias DC voltage source 44 which is applied to the ribbon across the growing interface 36. This voltage alters the local chemical potential in the vicinity of growing ribbon interface 36 and enhances the nucleation at the apex 40 of the growth. In the embodiment shown, the highest electric field due to the applied DC voltage will appear at the tip of the growing crystal. While one field direction is shown, the opposite direction may be required, depending on the ribbon material.

As cited earlier a modification of the apparatus may be used for those ribbon materials that exhibit an increase in electrical conductivity in the molten state. They can be melted by generating an eddy current across the ribbon substantially perpendicular to the pulling direction. The induced current in this modification is produced by a multiplicity of turns around the ribbon so that the plane of the coil is nearly parallel to the plane of the ribbon. The coil extends beyond the edges of the ribbon so that the induced current will lie substantially in the plane of the ribbon and is perpendicular to the pulling direction.

The apparatus of any of the preceding figures can, of course, be operated without the secondary heating source 16, when the properties of the ribbon material so warrant or the various embodiments shown can be built without the secondary heater. While all of the figures may suggest that the process applies only to horizontal pulling of the ribbon, no such orientation constraint of the apparatus is envisioned. The constraints imposed by gravity will of course apply to heat pipes if they are to be used as a heat sink for the apparatus. Similar gravitational constraints may apply for dense materials with low surface energy, such bismuth or lead. Moreover, the figures suggest that the secondary electrodes are all nominally rectangular. This is not a constraint envisioned. In particular, in accordance with well-known art, the heat sink 18 and/or the secondary heat source 16 may exhibit a curvature which is convex to the pulling direction so that the laterally central portion of the growing ribbon as well as the upper free surface (see the top view of FIG. 3) will exhibit nucleation and growth before the edges or the bottom of the ribbon. Such techniques to control nucleation are well-known to improve the as-grown crystal quality.

FIG. 7 of the drawings illustrates that for such materials as lead, although primary and secondary heaters are preferably coplanar, it is not necessary that they be. FIG. 7 shows primary heaters 14 which are on opposite sides of ribbon 20, and, therefore, not coplanar. This could, of course, be true even when the secondary heaters 16 are removed, or not used. In the case where primary electrodes are not coplanar, it may be desirable to have a second heat sink in order to establish better control of the profile of the melt zone in the ribbon.

While all of the discussion of the above has been directed toward a method and apparatus for recrystallizing the processed material to a monocrystalline form, those skilled in the art will recognize that the method and apparatus of the present invention can be useful to generally increase the crystal grain size of the processed material.

It should be appreciated that although this invention has been described in connection with certain sepcific examples thereof, no limitation is intended thereby except as defined in the appended claims.

I claim:

1. A method for forming a crystalline ribbon-like body of a material from a source body of the material, the ribbon-like body being defined principally by two pairs of parallel planar surfaces and being pulled from a molten zone, the molten zone being bounded principally by six surfaces, four of the surfaces being substantially coplanar with the surfaces defining the ribbon-like body, one of the four surfaces being a melting interface in the source body, the remaining two bounding surfaces of the molten zone being interfaces between the molten zone and the ribbon-like body and between the molten zone and a third body of the material, comprising the steps of:

coupling electromagnetic energy into a layer of material, confined by the four surfaces which are substantially coplanar to the four planes defining the ribbon-like body, by a primary heating means which induces electrical currents in the layer of material and causes at least a portion of the layer of material to attain a temperature near the material's melting temperature without melting the material, the primary heating means being a source of high-frequency voltage between a pair of electrodes, the electrodes being slightly spaced apart from one side of the film;

coupling additional electromagnetic energy by a secondary heating means into the portion of the layer of material which has attained a temperature near its melting point, thereby inducing additional electrical currents within the layer of material and causing the layer of material to melt, thereby creating the molten zone;

causing relative motion, in a direction parallel to the four planes defining the ribbon-like body, of the ribbon-like body with respect to the source body, the third body and the primary and secondary heating means;

moving the source body toward the molten zone at an angle to the direction of the relative motion of the ribbon-like body with respect to the source body, the third body, and the primary and secondary heating means, thereby replenishing the material withdrawn from the molten zone by the relative motion of the ribbon-like body; and controllably removing heat from the melted material in a direction substantially perpendicular to a plane defining the ribbon-like body of material.

2. A method for forming a crystalline ribbon-like body of a material from a source body of the material, the ribbon-like body being defined principally by two pairs of parallel planar surfaces and being pulled from a molten zone, the molten zone being bounded principally by six surfaces, four of the surfaces being substantially coplanar with the surfaces defining the ribbon-like body, one of the four surfaces being a melting interface in the source body, the remaining two bounding surfaces of the molten zone being interfaces between the molten zone and the ribbon-like body and between the molten zone and a third body of the material, comprising the steps of:

coupling electromagnetic energy into a layer of material, confined by the four surfaces which are substantially coplanar to the four planes defining the ribbon-like body, by a primary heating means which induces electrical currents in the material and causes at least a portion of the layer of material to attain a temperature near the material's melting temperature without melting the material, by connecting a first source of high-frequency voltage between a pair of substantially parallel electrodes, the electrodes being slightly spaced apart from one of the planes defining the ribbon-like body;

coupling additional electromagnetic energy into the portion of the layer of material confined by the four surfaces which are substantially coplanar to the four planes defining the ribbon-like body, by a secondary heating means which induces additional electrical currents in the source body and causes a portion of the layer of material that has attained a temperature near its melting point to melt by connecting a second source of high-frequency voltage between two sets of colinear electrodes, parallel to and between the electrodes of the primary heating means with respect to a plane of the ribbon-like body, thereby creating the molten zone;

causing relative motion of the ribbon-like body with respect to the source body, the third body, and the primary and secondary heating means, the direction of relative motion being parallel to the four planes defining the ribbon-like body and perpendicular to the electrodes of the primary and secondary heating means;

moving the source body toward the molten zone at an angle to the direction of the relative motion of the ribbon-like body with respect to the source body, the third body, and the primary and secondary heating means, thereby replenishing the material withdrawn from the molten zone by the relative motion of the ribbon-like body; and controllably removing heat from the melted material in a direction substantially perpendicular to a plane defining the ribbon-like body of material.

3. The method of claim 1, further comprising the step of altering the chemical potential at the nucleating tip of the ribbon of crystalline material by attaching a fifth electrode to the means for removing heat and a sixth electrode to the source body at a point where the source body is solid, the point being directed away from the molten zone in a direction opposite to the direction of motion of the ribbon-like body with respect to the source body, the third body, and the primary and secondary heating mns, and connecting a dc voltage source between the fifth and sixth electrodes.

4. A method for forming a crystalline ribbon-like body of a material from a source body of the material, the ribbon-like body being defined principally by two pairs of parallel planar surfaces and being pulled from a molten zone, the molten zone being bounded principally by six surfaces, four of the surfaces being substantially coplanar with the surfaces defining the ribbon-like body, one of the four surfaces being a melting interface in the source body, the remaining two bounding surfaces of the molten zone being interfaces between the molten zone and the ribbon-like body and between the molten zone and a third body of the material, comprising the steps of:

coupling electromagnetic energy into a layer of material, confined by the four surfaces which are substantially coplanar to the four planes defining the ribbon-like body, by a primary heating means which induces electrical currents in the material and causes at least a portion of the layer of material to attain a temperature near the material's melting temperature without melting the material, by connecting a first source of high-frequency voltage between a pair of substantially parallel coplanar electrodes, the electrodes being slightly spaced apart from one of the planes of the ribbon-like body;

coupling additional electromagnetic energy into the portion of the layer of material confined by the four surfaces which are substantially coplanar to the four planes defining the ribbon-like body, by a secondary heating means which induces additional electrical currents in the source body and causes a portion of the layer of material that has attained a temperature near its melting point to melt in the layer confined by the four surfaces which are substantially coplanar to the planes defining the ribbon-like body, by connecting a second source of high-frequency voltage between two substantially parallel electrodes, substantially parallel to and between the electrodes of the primary heating means with respect to a plane of the ribbon-like body, thereby creating the molten zone;

causing relative motion of the ribbon-like body with respect to the source body, the third body, and the primary and secondary heating means, the direction of relative motion being parallel to the four planes defining the ribbon-like body and perpendicular to the electrodes of the primary and secondary heating means;

moving the source body toward the molten zone at an angle to the direction of the relative motion of the ribbon-like body with respect to the source body, the third body, and the primary and secondary heating means, thereby replenishing the material withdrawn from the molten zone by the relative motion of the ribbon-like body; and controllably removing heat from the melted material in a direction substantially perpendicular to a plane defining the ribbon-like body of material.

5. The method of claim 4 wherein the movement of the source body is perpendicular to the direction of the relative motion of the ribbon-like body with respect to the source body, the third body, and the primary and secondary heating means.

6. A method for forming a crystalline ribbon-like body of a material from a source body of the material, the ribbon-like body including a monocrystalline seed of the material, the ribbon-like body being defined principally by two pairs of parallel planar surfaces and being pulled from a molten zone, the molten zone being bounded principally by six surfaces, four of the surfaces being substantially coplanar with the surfaces defining the ribbon-like body, one of the four surfaces being a melting interface in the source body, the remaining two bounding surfaces of the molten zone being interfaces between the molten zone and the ribbon-like body and between the molten zone and a third body of the material, comprising the steps of:

coupling electromagnetic energy into a layer of material, confined by the four surfaces which are substantially coplanar to the four planes defining the ribbon-like body, by a primary heating means which induces electrical currents in the layer of material by connecting first, second, and third substantially parallel electrodes slightly spaced apart from one of the planes of the ribbon-like body, to first and second high-frequency voltage sources, the two voltage sources operating at different frequencies, the first voltage souce being connected between the first and second electrodes and the second voltage source connected between the second and third electrodes, thereby creating the molten zone;

causing relative motion of the ribbon-like body with respect to the source body, the third body, and the heating means, the direction of relative motion being parallel to a plane of the ribbon-like body and perpendicular to the electrodes of the heating means;

moving the source body toward the molten zone at an angle to the direction of the relative motion of the ribbon-like body with respect to the source body, the third body, and the primary and secondary heating means, thereby replenishing the material withdrawn from the molten zone by the relative motion of the ribbon-like body; and controllably removing heat from the melted material in a direction substantially perpendicular to a plane defining the ribbon-like body of material.

7. The method of claim 6 wherein the movement of the source body is perpendicular to the direction of the relative motion of the ribbon-like body with respect to the source body, the third body, and the heating means.

* * * * *